United States Patent
Jenkins

(10) Patent No.: US 10,069,482 B2
(45) Date of Patent: Sep. 4, 2018

(54) DELAY LINE

(71) Applicant: Perceptia Devices, Inc., Scotts Valley, CA (US)

(72) Inventor: Julian Jenkins, Kurraba Point (AU)

(73) Assignee: Perceptia Devices, Inc., Morgan Hill, CA (US)

(*) Notice: Subject to any disclaimer, the term of this patent is extended or adjusted under 35 U.S.C. 154(b) by 63 days.

(21) Appl. No.: 15/275,018

(22) Filed: Sep. 23, 2016

(65) Prior Publication Data

US 2017/0040976 A1    Feb. 9, 2017

Related U.S. Application Data

(62) Division of application No. 14/155,226, filed on Jan. 14, 2014, now Pat. No. 9,484,889.

(30) Foreign Application Priority Data

Jan. 16, 2013 (AU) .............................. 2013900134

(51) Int. Cl.
| | |
|---|---|
| *G06F 17/10* | (2006.01) |
| *G06G 7/02* | (2006.01) |
| *H03H 17/02* | (2006.01) |
| *H03H 17/00* | (2006.01) |
| *H03H 17/08* | (2006.01) |

(52) U.S. Cl.
CPC .... *H03H 17/0248* (2013.01); *H03H 17/0009* (2013.01); *H03H 17/08* (2013.01)

(58) Field of Classification Search
CPC ............................. H03H 17/0009; H03H 17/08
USPC ............................................. 708/300–323, 819
See application file for complete search history.

(56) References Cited

U.S. PATENT DOCUMENTS

| | | | | |
|---|---|---|---|---|
| 5,729,613 | A * | 3/1998 | Poletti ................... | G10K 15/12 381/63 |
| 6,192,386 | B1 * | 2/2001 | Shinde ............... | H03H 17/0225 708/313 |
| 6,976,051 | B1 * | 12/2005 | Erdogan ................ | H03H 11/22 708/819 |
| 2005/0149592 | A1 * | 7/2005 | Harvey ............. | H03H 11/1217 708/300 |

\* cited by examiner

*Primary Examiner* — Tan V. Mai
(74) *Attorney, Agent, or Firm* — Grouwstra IC & Software Patent; André Grouwstra

(57) ABSTRACT

A delay line is constructed by combining a phase generator and a fabric. The phase generator splits a digital input signal in multiple incrementally delayed versions, which are input to the fabric. The fabric has an array of node filters. Inputs of filters in the first array column are inputs of the fabric. A node filter has a delay element and a cross-coupling element, whose output signals are added or subtracted to form a filter output signal. A node filter in a row is concatenated to the previous filter in the row through its delay element. Inputs of cross-coupling elements are connected to other array rows. Outputs of node filters form the outputs of the fabric. Delay times of delay elements and cross-coupling elements are nominally equal. Drive strengths of cross-coupling elements may be lower than drive strengths of delay elements.

19 Claims, 7 Drawing Sheets

M = 2, P = 1

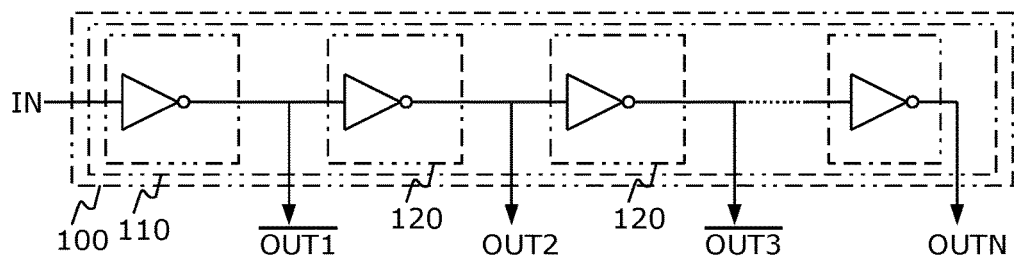
Figure 1 – Prior Art
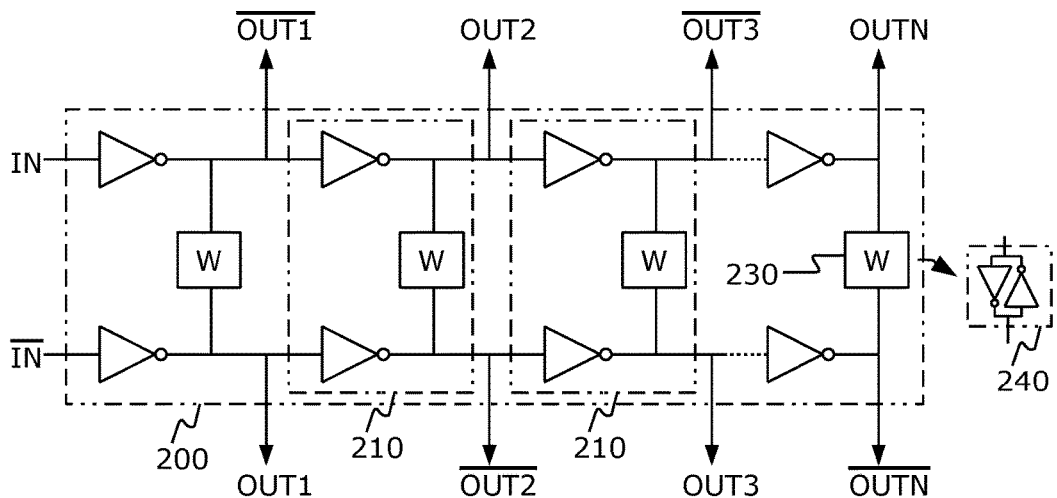
Figure 2 – Prior art
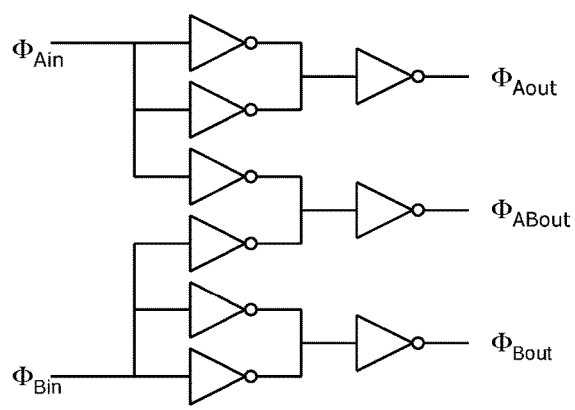
Figure 3a – Prior art
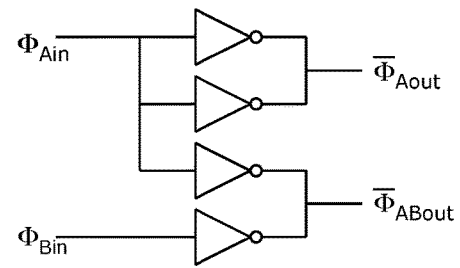
Figure 3b – Prior art

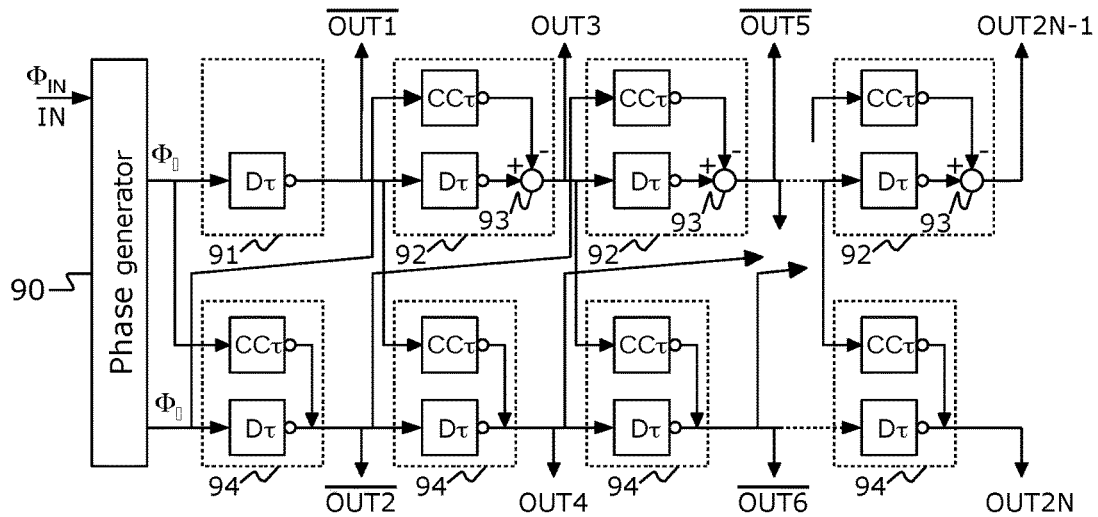
Figure 9 – M = 2, P = 1
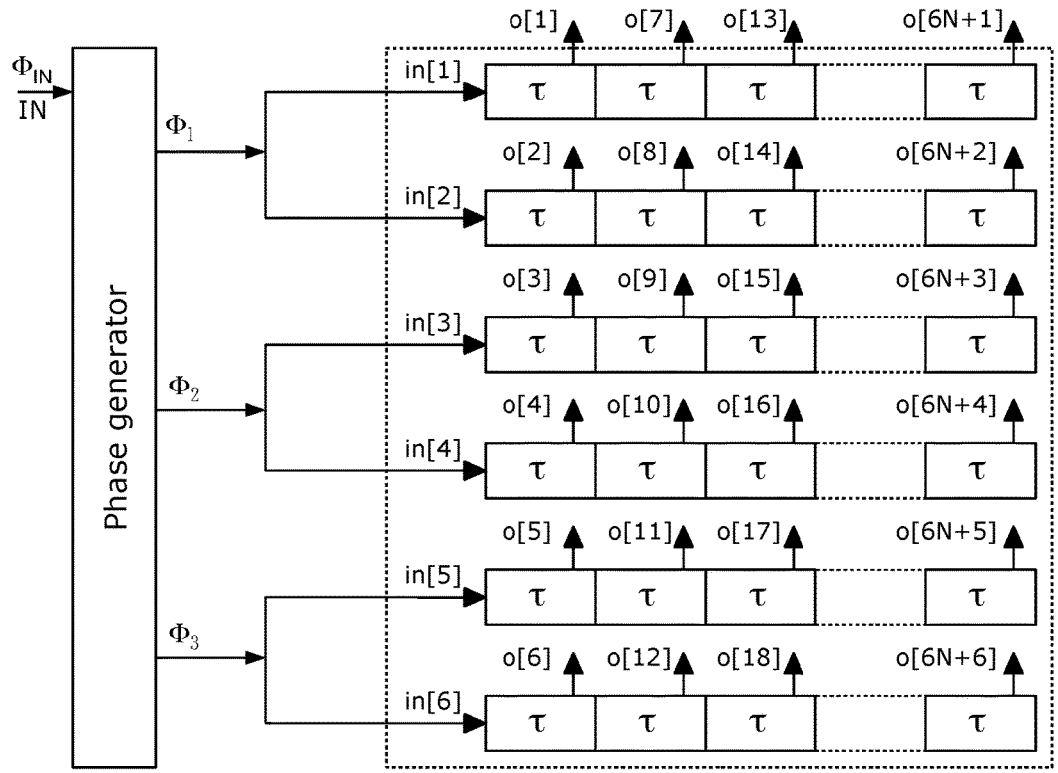
Figure 11 – M = 6, S = 3

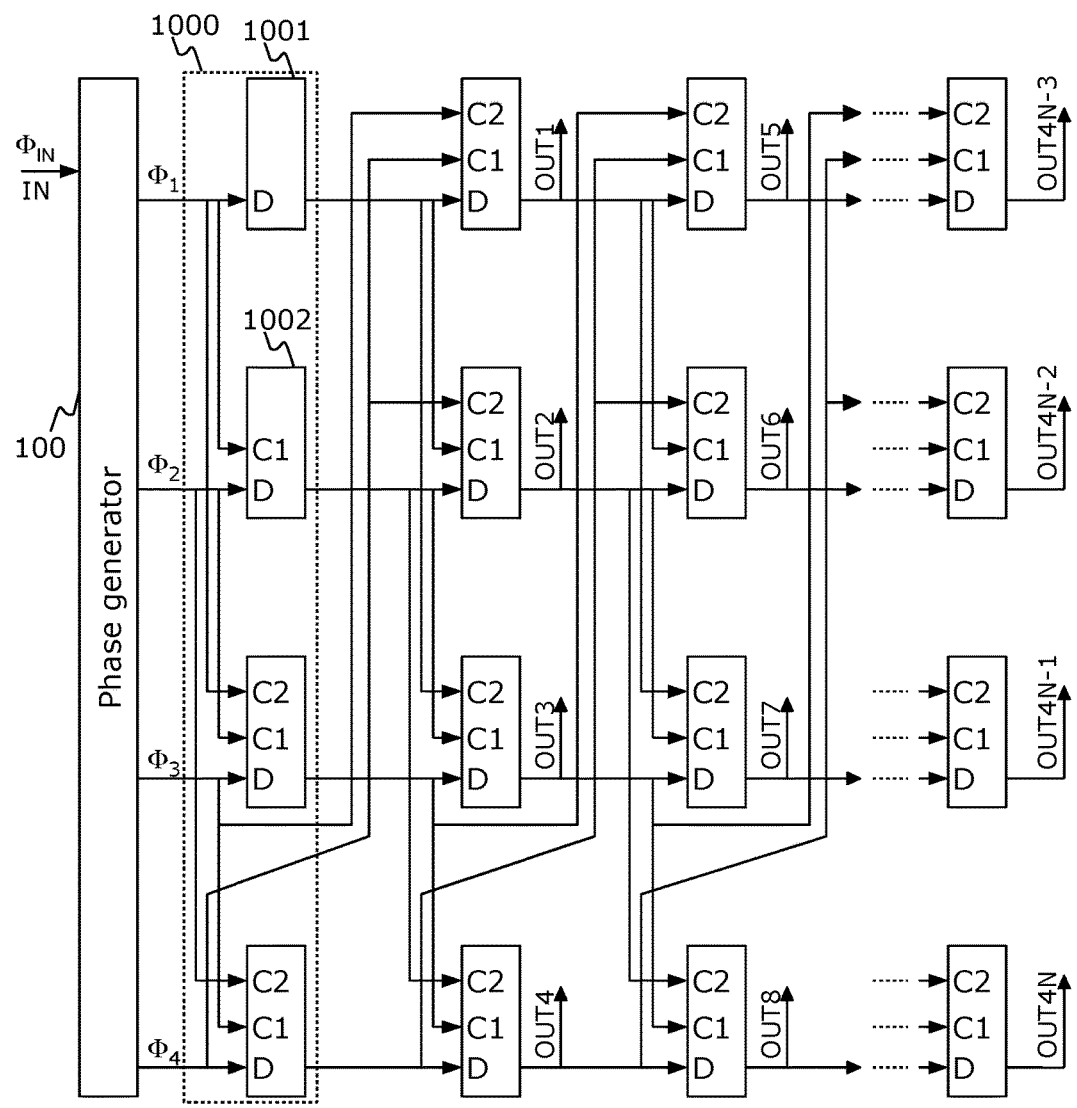
Figure 10 – M = 4, G = 1

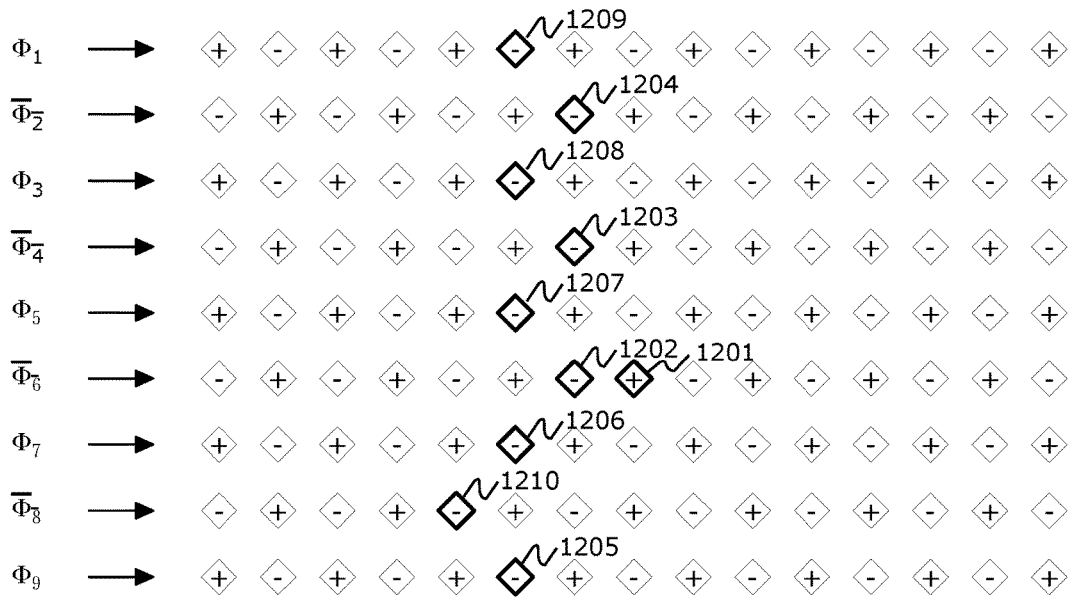
Figure 12 – M is odd, M ≥ 3
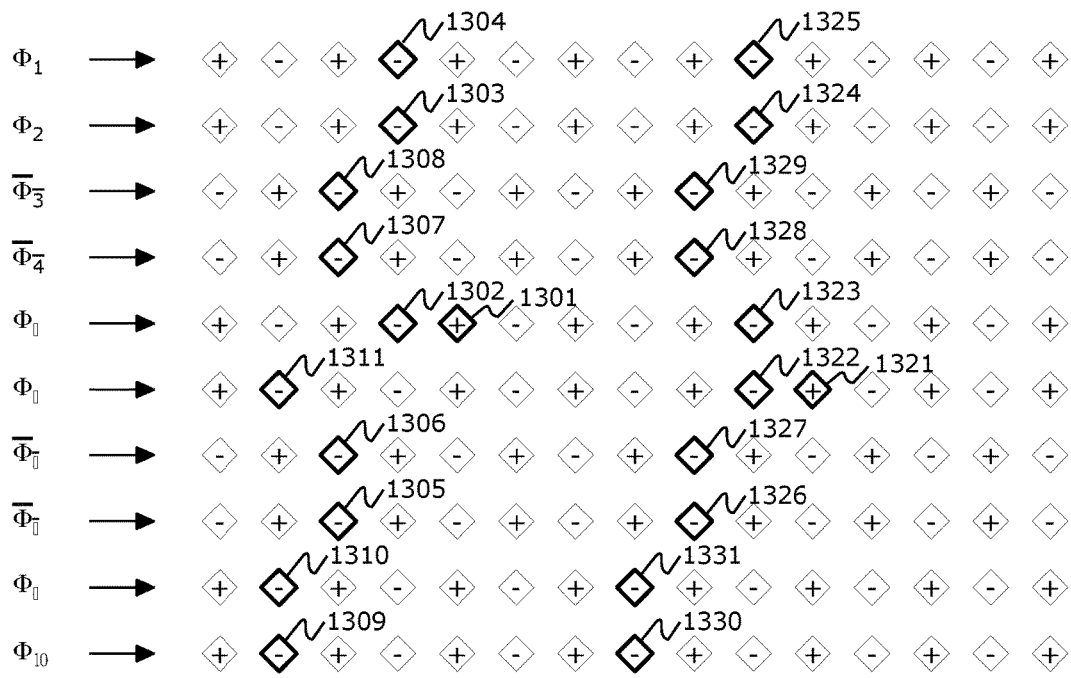
Figure 13

DELAY LINE

CROSS REFERENCES TO RELATED APPLICATIONS

This application claims priority from Australian Provisional Patent Application Serial No. 2013900134, entitled Delay Fabric Apparatus and Delay Line, filed on Jan. 16, 2013, which is hereby incorporated by reference herein for all purposes.

This application is a divisional from U.S. patent application Ser. No. 14/155,226, entitled Delay Fabric Apparatus and Delay Line, filed on Jan. 14, 2014, which is hereby incorporated by reference as if set forth in full in this application for all purposes.

BACKGROUND

The present invention relates generally to electronic circuits that delay digital signals in continuous time and in particular to circuits used in time-to-digital convertors (TDC), digital phase locked loops (PLLs), fractional-N PLLs, and clock deskew circuits.

Typically, a delay line comprises a delay chain, which is a chain of delay elements. This is illustrated in FIG. 1, where the delay line 100 comprises a single-ended delay chain 110, built up with N consecutive delay elements 120, where N is 1 or larger. Usually a delay element consists of one or more digital gates, whereby a variety of gates may be used, the simplest and often fastest being a single inverter, as depicted. In this case, the successive outputs will have alternating polarity. The overline on outputs $\overline{OUT1}$, $\overline{OUT3}$ and successive odd-numbered outputs indicates that their polarity is reversed in reference to the input signal IN. The resolution of the delay line equals the average delay T of single inverters (the nominal or unit delay time), and the range provided by the delay line equals N×T.

In physical embodiments of delay lines, manufacturing tolerances can cause mismatch between the components, leading to differences in delay between different instances of the delay element that are designed to be identical. Thus, the real delay of a given delay element may not be accurately known. For some manufacturing processes, including for components integrated on a single semiconductor chip, these differences can be significant. When delays vary between instances that have been designed to be identical, all identical instances are considered to have a nominal delay and each individual instance has a real delay which is the nominal delay plus or minus some error. In some applications, alternating polarity signals can be used as easily as signals of the same polarity. In other applications, the polarity must be the same for all outputs. In such a case, every second output may be used, at the expense of loss of resolution (which becomes 2τ).

One common solution is to use a differential delay chain (see FIG. 2), which offers both inverted and non-inverted polarity signals. The delay chain 200 comprises N consecutive delay elements 210. The delay elements each delay both the propagated IN and overline $\overline{IN}$ signals. Although the polarity alternates using simple inverters, at each stage J there is an output signal OUTJ as well as an inverted signal $\overline{OUTJ}$ available.

Due to mismatch between the physical circuits, significant skew might appear between the two propagating signals. This can be corrected by using deskew circuits W (230) in the delay elements. This may comprise cross-coupled weak inverters as shown in detail in box 240. In this context, weak means that the drive strength of the cross-coupled inverters is less than that of the forward inverters in the chain, so that the cross-coupled inverters can help but not dominate the state of the output nodes. The inverter pair helps to deskew the propagating signals by speeding up the slow output node and slowing down the fast output node.

The above differential delay chain solves some important limitations. However, other design disadvantages include sensitivity of the delay to temperature and slow and fast power supply variations, and the fact that some applications require a resolution which is finer than the average delay of a single inverter. Yet other applications require a delay time that can be controlled.

To reduce the delay sensitivity to temperature and supply voltage, or to control the unit delay, the delay chain can operate from a regulated supply voltage. An alternative approach is current starving the gates, where the gates essentially no longer operate from a regulated supply voltage but from a regulated supply current. In either case, the regulated supply can be used to compensate for temperature variation, or to control the average delay of the delay elements. Whether a regulated supply voltage or regulated supply current is used, designers have to make sure that the output of such a supply source has a sufficiently high bandwidth, otherwise short-term timing variations or jitter will occur. One approach has been described in U.S. Pat. No. 6,476,656 (W. J. Daily et al.).

A further way of controlling the speed of the delay elements is by varying the back-gate voltage of the MOS transistors used in the gates.

In applications where not all outputs (output taps) are used simultaneously, the resolution can be improved below τ by selecting two neighboring outputs and passing their signals to a phase splitter or phase generator, which interpolates a few more phases. However, this solution is impractical for applications where all signals need to be available simultaneously.

Phase generators are commonly built using phase blenders, blocks that provide a phase blending technique (illustrated in FIGS. 3a-b). Signals with phase $\Phi_{Ain}$ and $\Phi_{Bin}$, which are one unit delay apart, are applied to the inputs in order to create an output signal, the phase $\Phi_{ABout}$ of which is in between $\Phi_{Aout}$ and $\Phi_{Bout}$. FIG. 3a shows a non-inverting circuit that propagates both $\Phi_A$ and $\Phi_B$ along with $\Phi_{AB}$. FIG. 3b shows a reduced circuit which does not propagate $\Phi_B$, only the inverted versions of $\Phi_A$ and $\Phi_{AB}$. Phase blenders in current mode logic (CML) have a topology modified from FIGS. 3a-b (not depicted).

The circuit of FIGS. 3a-b can generate any phase $\Phi_{ABout}$ in between $\Phi_{Aout}$ and $\Phi_{Bout}$. The relative strengths of the inverters in the path from $\Phi_{Ain}$ to $\Phi_{ABout}$ and $\Phi_{Bin}$ to $\Phi_{ABout}$ control the phase, with more strength in the path from $\Phi_{Ain}$ pulling $\Phi_{ABout}$ closer to $\Phi_{Aout}$ and more strength in the path from $\Phi_{Bin}$ pulling $\Phi_{ABout}$ closer to $\Phi_{Bout}$. By replicating the part of the circuit that generates $\Phi_{ABout}$, and changing the ratios on the different instances, multiple output phases can be generated simultaneously.

Multistage approaches are common, where the output signals of one blender can be used as inputs for two or more blenders in the next stage. Phase generators according to different topologies have also been reported.

Using modern IC fabrication processes, where components do not match accurately, phase blenders and phase generators have limited timing accuracy, and signals propagate through a delay chain at variable speed. Thus, an unmet need exists for a system that overcomes the accuracy problems and provides a resolution smaller than the nominal delay τ.

SUMMARY

The present invention is directed to delay lines fabricated in modern semiconductor production processes, providing resolutions smaller than the unit delay of the fastest delay elements available.

Embodiments of the invention include a delay line with an input and four or more outputs. The delay line comprises a phase generator with an input and two or more outputs and a delay fabric with two or more inputs and four or more outputs.

The phase generator is configured to generate copies of an input signal at its two or more outputs, the copies occurring at evenly spaced delays after the input signal. The delay fabric is configured for delaying digital signals at its two or more inputs in continuous time, and presenting the delayed digital signals at its four or more outputs.

The delay fabric comprises an array of node filters. A node filter comprises a delay element and a cross-coupling element. A first input of the node filter is electrically coupled with an input of the delay element. A second input of the node filter is electrically coupled with an input of the cross-coupling element. Output signals of the delay element and the cross-coupling element are added to or subtracted from each other to form an output signal of the node filter. An output of a first prior node filter is electrically coupled with the first input of the node filter. An output of a second prior node filter is electrically coupled with the second input of the node filter, and an output of the node filter, carrying the output signal, is electrically coupled to an output of the delay fabric.

The delay element and the cross-coupling element may have nominally equal delay times. In embodiments, the cross-coupling element may have a lower drive strength than the delay element. In other embodiments, there may be additional cross-coupling elements.

The array may be arranged in columns and rows, where node filters are counted column-wise, starting with a node filter of a first row of a first column, followed by a node filter of a second row of the first column. A first node filter of a subsequent column follows a last node filter of its directly preceding column, and ends with the node filter of the last row of the last column. Inputs of node filters in the first column are electrically coupled with inputs of the delay fabric. Inputs of node filters in a subsequent column are electrically coupled with outputs of node filters in a directly prior column, and outputs of node filters are electrically coupled with outputs of the fabric.

In some embodiments, the fabric may further include guard node filters for initially correcting signals provided to and propagating through the fabric, and in some embodiments, the fabric may include dummy node filters for giving a last column of node filters electrically coupled with outputs of the delay fabric the same physical loading as outputs of preceding columns of node filters.

Further aspects of the present invention and further embodiments of the aspects described in the preceding paragraphs will become apparent from the following description, given by way of example and with reference to the accompanying drawings.

BRIEF DESCRIPTION OF THE DRAWINGS

Aspects and embodiments of the invention are described hereinafter, by way of example only, with reference to the drawings, in which:

FIG. 1 illustrates a conventional delay chain using single inverters;

FIG. 2 illustrates a conventional differential delay chain with skew compensation;

FIGS. 3a and 3b illustrate block diagrams showing a conventional phase blender circuit and a version with reduced functionality;

FIG. 9 illustrates a delay line in accordance with an embodiment of the invention with two delay chains with inverting elements;

FIG. 10 illustrates an embodiment of the invention with four phases;

FIG. 11 illustrates a delay line in accordance with an embodiment of the invention for a delay fabric with M=6, using a 3-way (S=3) phase generator;

FIG. 12 illustrates using a checkerboard polarity pattern for embodiments with single-ended inverting delay elements; and FIG. 13 illustrates how a modified checkerboard polarity pattern can be used for certain embodiments with even M.

DETAILED DESCRIPTION

Apparatuses for implementing delay fabrics, methods of delaying signals in fabrics, and delay lines are disclosed hereinafter. In the following description, numerous specific details, including particular transistors, gates, and the like are set forth. However, from this disclosure, it will be apparent to those skilled in the art that modifications and/or substitutions may be made without departing from the scope and spirit of the invention. In other circumstances, specific details may be omitted so as not to obscure the invention.

The embodiments of the invention relate to delay fabrics and delay lines for digital signals, i.e. electronic circuits that delay digital signals in continuous time in multiple stages, which are observable from their output taps. Delay fabrics can be used in delay lines and in phase generators. Delay lines are used in various mixed-signal and digital applications that need to either provide a specified delay for a digital clock or signal, or measure the time elapsed between a first and a second clock or signal. The applications include time-to-digital convertors, fractional-N PLLs, clock deskew circuits and other systems. Embodiments of the invention overcome or reduce accuracy problems of conventional systems and are able to provide a resolution smaller than a nominal delay τ.

Introduction

A "delay fabric" is a two dimensional array of node filters, capable of generating multiple simultaneous output signals each evenly spaced a small time apart, such time being a fraction of the nominal delay time τ (the unit time) of delay elements used in the delay fabric. Embodiments of the invention include an apparatus implementing a delay fabric. Embodiments of the invention also relate to a method for generating such output signals. Further, a delay line is proposed comprising a phase generator and a delay fabric. To achieve a resolution that is finer than the average delay $\tau$ of a single inverter, embodiments of the invention provide a delay fabric as an array of at least two columns and at least two rows of node filters carrying a signal, where node filters are concatenated horizontally. A single row in the delay fabric has a resolution of $\tau$, meaning that the phase of each node filter output lags the phase of the preceding node filter output by $\tau$, since the delay of a node filter is determined by the delay $\tau$ of the delay element and cross-coupling elements comprised in the node filter.

A phase in between can be carried by employing an additional row, which has an input signal with a sub-unit phase delay from the first row. Additional phases in between can be obtained by employing additional rows. Time-shifted input signals may be generated by a phase generator.

Figure 4:
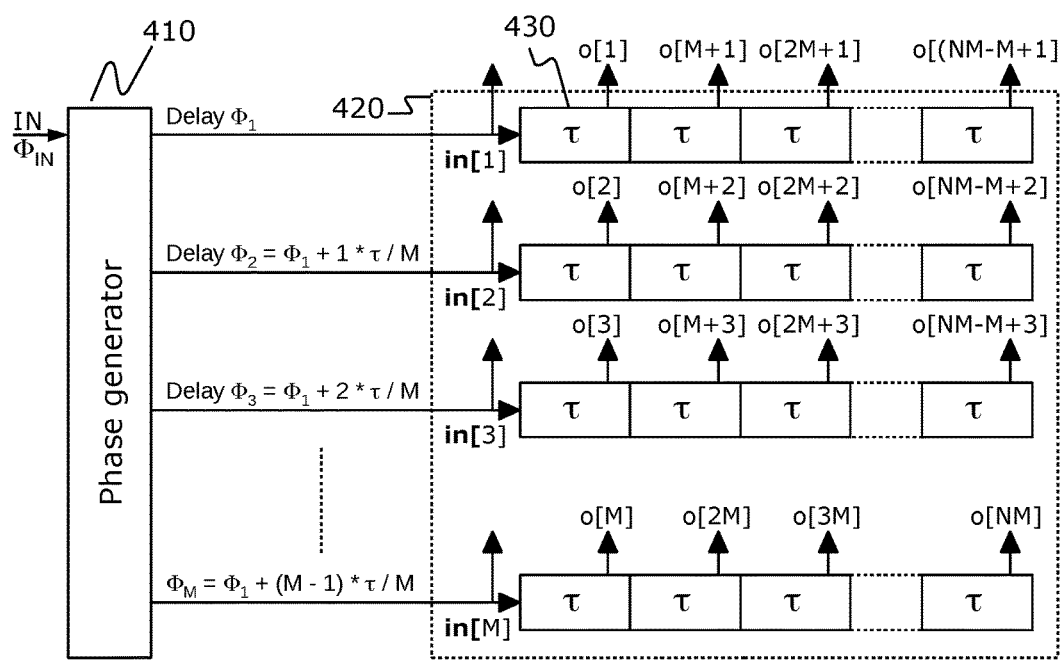
FIG. 4 illustrates a delay line employing a delay fabric in accordance with an embodiment of the present invention.

FIG. 4 illustrates a delay line employing a delay fabric in accordance with an embodiment of the present invention. It shows a phase generator 410 and a delay fabric 420 comprising an array of node filters 430 with nominal delay $\tau$. Node filters are numbered column-wise starting from the top left and ending at the bottom right. The first column of node filters has outputs o[1] through o[M]. Nodes filters are electrically coupled horizontally. Cross connections will be shown later.

To achieve a resolution of $\tau/M$ for a delay line that has delay elements with a unit delay $\tau$, where M is 2 or larger, the phase generator 410 may split the input signal IN, which has phase $\Phi_{IN}$, in M signals with evenly spaced phases (delays) $\Phi_1$ through $\Phi_M$, each of which being a fraction $\tau/M$ apart. Thus, the phase $\Phi_M$ has a delay of $\tau \times (M-1)/M$ compared to $\Phi_1$. This is just one resolution step $\tau/M$ less than the delay of the first node filter, of which output o[1] is shown. For instance, in a system with resolution 0.25×$\tau$, four signals may be needed (M=4) from the phase generator, and $\Phi_4$ has a delay of 0.75×$\tau$ compared to $\Phi_1$. The signals $\Phi_1$ through $\Phi_M$ are applied to the inputs of M rows in the delay fabric, from where they propagate from left to right. The rows of the delay fabric, consisting each of N delay elements 430, propagate the M phases to their final node filters, so this delay line can have N×M outputs, providing a delay range of N×$\tau$. The consecutively phased output signals are available from the outputs o[1], o[2], o[3], etc. through o[NM].

Figure 5:
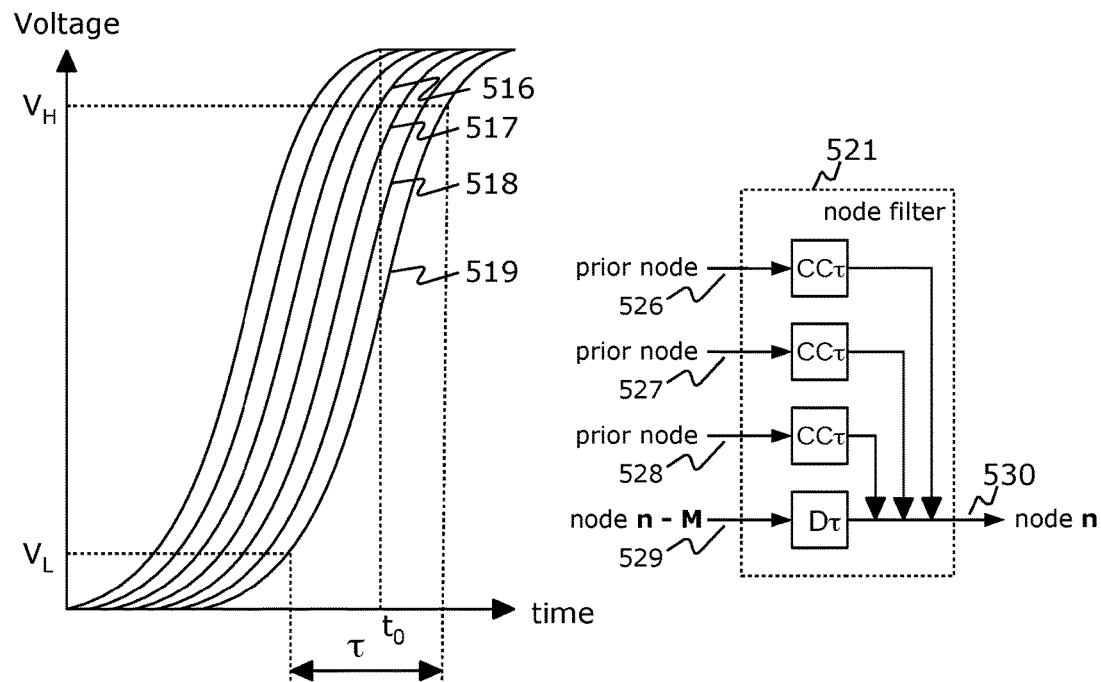
FIG. 5 illustrates an example plot of voltage against time and an example circuit diagram of an embodiment of the present invention using multiple prior phases to correct for timing errors.

FIG. 5 illustrates an example plot of voltage against time and an example circuit diagram of an embodiment of the present invention using multiple prior phases to correct for timing errors in a delay fabric by using both forward and cross-coupling of signals. Phase generators are often not very accurate, and neither are the smallest and highest speeds individual delay elements in an integrated circuit. Therefore, signals propagating through the different rows of the delay fabric may accumulate considerable skew, and further improvement is needed. To provide this, embodiments of the invention may use the fact that the delay time $\tau$ of a gate is in the order of its rise or fall time, dependent on the gate type. This means that in a delay line with resolution substantially smaller than $\tau$, signal transitions of adjacent outputs have a period of overlap, although those outputs show different stages of the transition. For instance, while at time $t_0$ the output signal with phase 519 rises between a low voltage $V_L$ and a high voltage $V_H$, several of the outputs with preceding phases, including 518, 517, and 516, are still rising too.

Embodiments of the invention capitalize on this by obtaining a node signal (say, 530 on node n) not just from a delay element at carrying a delayed signal 529 from one prior node n–M, but using a node filter 521 also from delayed and scaled signals at other prior nodes (in the case shown: 528, 527 and 526), transferred by cross-coupling elements CC$\tau$ with nominal delay $\tau$. These prior nodes may for instance be in the range n–3M through n–M–1, where consecutive versions of the transitioning signal can be found. The node filter 521 depicted in FIG. 5 has one D$\tau$ input and three CC$\tau$ inputs. More generally, a node filter may have one at input and P inputs for prior nodes (CC$\tau$ inputs).

As a result of the combined forward and cross connections, the effect of an individual mismatching gate is averaged out, and the outputs of every row in the delay fabric are dependent on earlier outputs of multiple other rows in the delay fabric. A further result is that rows in the delay fabric are synchronized and accumulation of skew is eliminated. Additionally, if a phase generator that delivers the input phases for the delay fabric is quite inaccurate, the errors of the phase generator are corrected in the initial columns of the delay fabric. Experiments have shown that even if all inputs of the delay fabric are electrically coupled to the same input signal, after a number of columns the node filters in the delay fabric carry properly spaced phases.

A method to simultaneously generate multiple sub-unit-delay time-shifted output signals comprises feeding M delayed versions (phases) of an input signal, which may be created by a phase generator, each having a delay of $\tau/M$ compared to its previous phase; forwarding these signals to the input nodes of a delay fabric of at least M rows and at least (1+N) columns containing M×N output node filters; and using node filters to calculate each output value using output values from several neighboring earlier node filters to keep the rows of the delay fabric synchronized.

Delay Fabric and Delay Line

Figure 6:
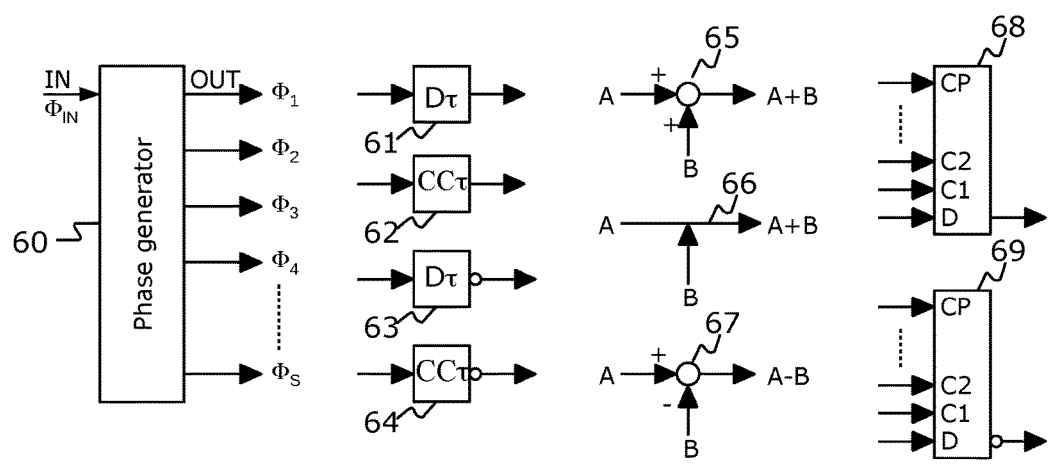
FIG. 6 illustrates a block diagram showing the main building blocks for a delay line and delay fabric in accordance with embodiments of the invention.

FIG. 6 illustrates a block diagram showing the main building blocks for a delay line and delay fabric in accordance with embodiments of the invention.

Item 60 depicts a phase generator with an input signal $\Phi_{IN}$ and S output signals with delay (phase) $\Phi_1$ through $\Phi_S$, where S is a natural number of 2 or larger. The output signals $\Phi_1$ through $\Phi_S$ are used for feeding M separate inputs of a delay fabric. Ideally, S equals M, but if S is smaller than M, the S signals may be branched out to electrically couple to all M inputs.

Item 61 depicts a non-inverting delay element D$\tau$, where $\tau$ stands for the average delay time achieved by multiple delay elements of the same implementation (the unit delay or nominal delay). Item 63 depicts an inverting delay element at with nominal delay $\tau$. A delay fabric contains rows with multiple concatenated delay elements 61 and/or 63, each comprised in a node filter. Item 62 depicts a non-inverting cross-coupling element CC$\tau$, which provides a scaling function (in a physical embodiment through its drive strength) as well as a nominal delay $\tau$. Item 64 depicts an inverting cross-coupling element CC$\tau$ with the same nominal delay $\tau$ and scaling function. Cross-coupling elements CC$\tau$ are used inside of the node filters to electrically couple to outputs of prior node filters situated on other rows in the delay fabric. Whenever this document uses the words electrically couple or concatenate, the electrical coupling or concatenation of elements is meant such that electric signals can flow from one element to the other.

Multiple cross-coupling elements used in an embodiment of the invention are not required to have the same strength.

Thus, two instances of symbol 62 or 64 used in the same delay fabric, or node filter, may have different forwarding strength. For instance, compared to a delay element of 61 or 63, one cross-coupling element may have the same relative transfer strength whereas another cross-coupling element may attenuate its signal.

Items 65 and 66 show two equivalent representations of an adder, which produces the signal A+B from its inputs A and B. For brevity the drawings in this document commonly show an adder as depicted in 66. Item 67 shows a subtracter, which produces the signal A−B at its output.

Item 68 depicts a node filter, with one Dτ input (D-input) and P CCτ inputs (C-inputs), as well as one output. Item 69 depicts a node filter with inverting elements.

Also for brevity, the building blocks 60 through 69 are shown as if used for single-ended signals. However, in many cases differential signals may be used, where the blocks can be used both with inverting and non-inverting functionality. Therefore, the notation in FIG. 6 does not convey whether the actual signals are single-ended or differential, and an embodiment may use signals of either type.

Figure 7A:
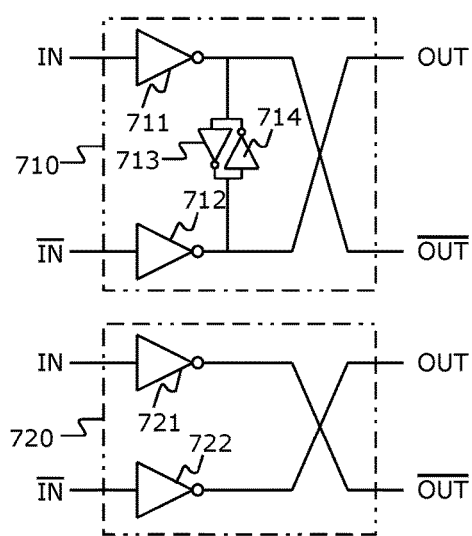
FIGS. 7a and 7b illustrate schematic circuit diagrams of delay elements and cross-coupling elements in accordance with embodiments of the invention.
Figure 7B:
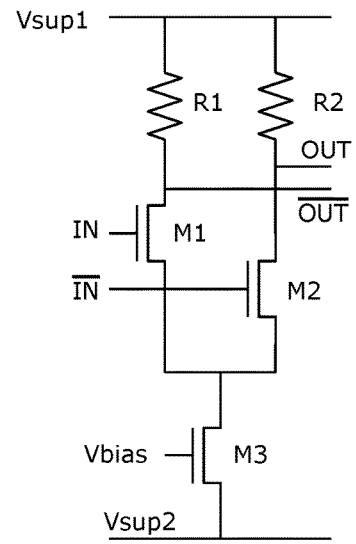

FIGS. 7*a* and 7*b* illustrate schematic circuit diagrams showing delay elements and cross-coupling elements in accordance with embodiments of the invention. An embodiment for the delay element DT for differential signals is provided in circuit 710 in FIG. 7*a*. This circuit 710 shows forward inverters 711 and 712 to provide the main delay function and cross-coupled weak inverters 713 and 714 to provide deskew. Since the circuit 710 handles differential signals, the circuit 710 can be used both as an embodiment of both block 61 and block 63.

A non-inverting input of the delay element 710 is electrically coupled with an input of a first inverter 711. An output of the first inverter 711 is electrically coupled with an inverting output of the delay element 710. An inverting input of the delay element 710 is electrically coupled with an input of a second inverter 712. An output of the second inverter 712 is electrically coupled with a non-inverting output of the delay element 710. The first inverter 711 and the second inverter 712 may have equal drive strengths. An input of a third inverter 713 is electrically coupled with the output of the first inverter 711, and an output of the third inverter 713 is electrically coupled with the output of the second inverter 712. An input of a fourth inverter 714 is electrically coupled with the output of the second inverter 712, and an output of the fourth inverter 714 is electrically coupled with the output of the first inverter 711. A drive strength of the third inverter 713 may equal a drive strength of the fourth inverter 714, and the drive strengths of the third and fourth inverters 713 and 714 may be less than the drive strengths of the first and second inverters 711 and 712.

The inverters 711 through 714 may be physically implemented in any type of microelectronics digital technology, including but not limited to CMOS, NMOS, PMOS, JFET, bipolar, BiCMOS, HBT, FinFET, voltage mode logic, current mode logic, and even technologies that may not exist yet. Additionally, the gates may include techniques to control their delay time and reduce jitter, including but not limited to supply voltage regulation, supply current regulation, back-gate biasing, shunt capacitor tuning, cascoding, etc.

An embodiment for the cross-coupling element CCτ for differential signals is illustrated in circuit 720 in FIG. 7*a*. Since the circuit 720 handles differential signals, the circuit 720 can be used both as an embodiment of both block 62 and block 64.

A non-inverting input of the cross-coupling element 720 is electrically coupled with an input of a first inverter 721. An output of the first inverter 721 is electrically coupled with an inverting output of the cross-coupling element 720. An inverting input of the cross-coupling element 720 is electrically coupled with an input of a second inverter 722. An output of the second inverter 722 is electrically coupled with a non-inverting output of the cross-coupling element 720. The first inverter 721 and the second inverter 722 may have equal drive strengths.

The inverters 721 and 722 may be physically implemented in any type of microelectronics digital technology, including but not limited to CMOS, NMOS, PMOS, JFET, bipolar, BiCMOS, HBT, FinFET, voltage mode logic, current mode logic, and even technologies that may not exist yet. Additionally, the gates may include techniques to control their delay time and reduce jitter, including but not limited to supply voltage regulation, supply current regulation, back-gate biasing, shunt capacitor tuning, cascoding, etc.

The circuit in FIG. 7*b* shows another embodiment for differential signals of both the delay element DT and the cross-coupling element CCτ. Since it handles differential signals, the circuit can be used in embodiments of all blocks 61, 62, 63, and 64. Transistor M3 acts as a current source, controlled by the voltage Vbias on its gate. Transistors M1 and M2, of which the sources are electrically coupled to the drain of M3, act as a current switch. Dependent on the differential input voltage IN applied to the gate of M1 and $\overline{\text{IN}}$ applied to the gate of M2, most of the current delivered by M3 will flow through either M1 or M2. Since most of that current must flow through either R1 or R2, there will be a differential output voltage between the output nodes OUT and $\overline{\text{OUT}}$. Current switches are known to be very fast, which helps to keep the delay time τ small. The bias voltage Vbias allows some control of the delay time τ, which may include compensation for the effects of temperature variations. No separate deskew between components of the differential signal is needed.

A node filter comprises one delay element Dτ and P cross-coupling elements CCτ. For common node filters P is at least 1, but for a reduced node filter P may be 0. The P cross-coupling elements CCτ may have individual drive strengths, which each may be different from or equal to the drive strength of the one delay element Dτ. The output signals of the P cross-coupling elements CCτ and the one delay element Dτ are added to each other, forming the output signal of the node filter. The input of the one delay element DT and the P cross-coupling elements CCτ form the 1+P inputs of the node filter.

A delay fabric comprises a two-dimensional array of node filters, where each input or output of a node filter or of the delay fabric itself represents one electrical signal in case of a single-ended embodiment or two electrical signals in case of an embodiment for differential signals. The delay fabric offers N×M output nodes with a delay range of N×τ and a resolution of τ/M, where N and M are natural numbers larger than 1. The delay fabric includes (1) G columns of M guard node filters, where G may be 0 or larger; (2) N columns of M output node filters; and (3) D columns of M dummy node filters, where D may be 0 or larger. Thus, the delay fabric has a total of M×(G+N+D) node filters.

Node filters in the delay fabric are counted column-wise, starting with the node filter of the first row of the first column, followed by the node filter of the second row of the first column, etc. and ending with the node filter of the last row of the last column.

The inputs of the M node filters in the first column may form M inputs of the delay fabric.

The output of each node filter n in the delay fabric, apart from the M node filters in its last column, is electrically coupled with the D-input of a node filter, of which the location is M later than n (node filter n+M). Most of these are common node filters.

Common node filters may be functionally identical. They may provide the same number P (where P is larger than zero) of cross-coupling elements CCτ and an equal profile of drive strengths for the P cross-coupling elements CCτ. The P inputs of their CCτ elements (the C-inputs) may be electrically coupled with the outputs of prior (counting column-wise) node filters in the same pattern. For example, for node filters with P=2 and relative strengths 75% and 50% of the C-inputs compared to the D-input, all common node filters may have their first C-input electrically coupled one node filter prior to the node filter electrically coupled to the D-input, and their second C-input electrically coupled three nodes prior to the node filter electrically coupled to the D-input. C-inputs do not need to be electrically coupled to consecutive nodes. However, for most practical purposes they are only electrically coupled to the output of node filters not more than M locations prior to the node filter electrically coupled to the D-input.

In that case, each node filter beyond the first column is a common node filter.

Node filters of the first column may be common node filters, if their C-inputs can be electrically coupled in the same pattern. If target input signals do not exist, then the respective C-inputs can be electrically coupled to the first available node, or CCτ elements and C-inputs may be left out for inputs that do not exist (it becomes a reduced node filter). Generally, the first node filter (first column, first row) may be replaced by or reduced to a single Dτ element.

Only output node filters provide output signals of the delay fabric. Guard node filters are used for cleaning up poorly timed input signals. Dummy node filters are used to physically load the last column of output nodes, in order to maintain their proper timing. Both guard node filters and dummy node filters are optional.

A delay line may comprise a phase generator that is common in the art, with one input and S outputs, and a delay fabric of M rows and M inputs. At least two of the S outputs of the phase generator are electrically coupled with the M inputs of the delay fabric in such a manner that one phase generator output can electrically couple with multiple consecutive delay fabric inputs, but one delay fabric input cannot electrically couple with multiple phase generator outputs. Additionally, each delay fabric input needs to receive a signal of which the phase is not earlier than of the signal received by the prior input. The input of the phase generator forms the input of the delay line, and the outputs of the delay fabric form the outputs of the delay line.

A method to generate M×N output signals of a delay fabric comprises providing S successively delayed versions of an input signal to the delay fabric, wherein the distance between the signals spans an average time of τ/S, and S may have a value as large as M, but must be at least 1 and does not need to be larger than M. In case S is smaller than M, groups of consecutive inputs of the delay fabric may jointly be electrically coupled to consecutive delayed versions of the input signal. While the successively delayed versions of the input signal ripple through the delay fabric, the value of each output is generated by its output node filter as a weighted sum of the signals provided to the one delay element of the output node filter, and the P cross-coupling elements of the output node filter.

A method to generate M×N equally spaced output signals of a delay fabric comprises providing S successively delayed versions of an input signal to a delay fabric which has sufficient columns of guard node filters, where the distance between the signals spans an average time of τ/S, where S may have a value preferably as large as M, but must be at least 1 and does not need to be larger than M. In case S is smaller than M, groups of consecutive inputs of the delay fabric may jointly be electrically coupled to consecutive delayed versions of the input signal. While the successively delayed versions of the input signal ripple through the guard node filters, properly spaced timing is restored, and while the successively delayed versions of the input signal ripple further through the output node filters, the value of each output is generated by its output node filter as a weighted sum of the signals provided to the one delay element of the output node filter, and the P cross-coupling elements of the output node filter. The delay fabric may include at least one column of dummy node filters, which are used for proper physical loading of the last column of output node filters.

A method to generate M×N equally spaced output signals of a delay line comprises providing an input signal to the input of the phase generator, to create M successively delayed versions of the input signal for the delay fabric, where the distance between the signals spans an average time of τ/M. While the successively delayed versions of the input signal ripple through the delay fabric of M rows and at least N columns, the value of each output is generated by its output node filter as a weighted sum of the signals provided to the one delay element of the output node filter, and the P cross-coupling elements of the output node filter. The method may further include restoring proper timing by propagating the signal through sufficient columns of dummy node filters prior to the output node filters, and proper physical loading of the last column of output node filters by including at least one column of dummy node filters after the last column of output node filters.

Figure 8:
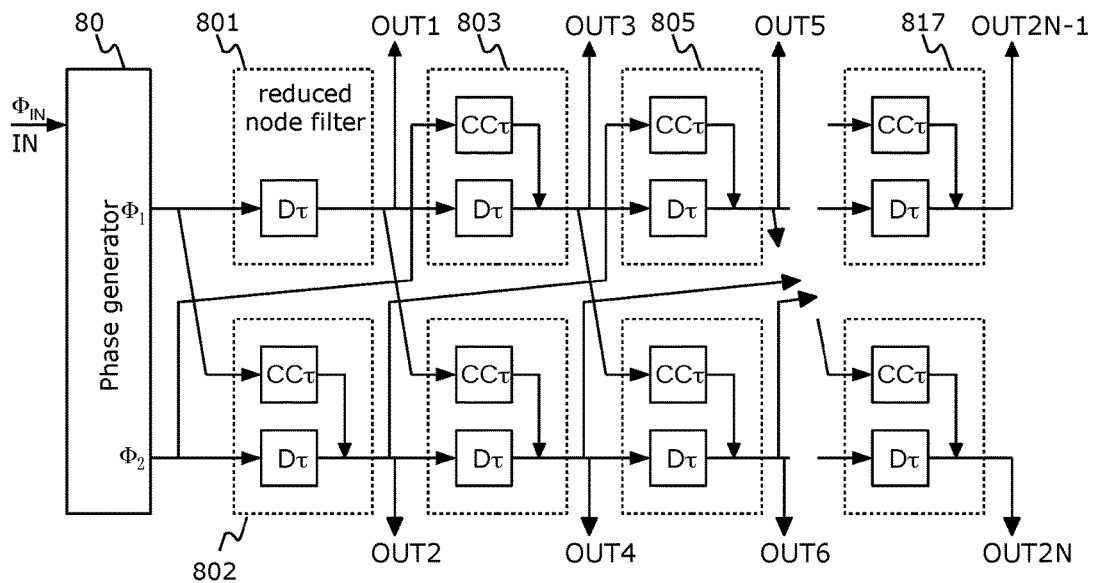
FIG. 8 illustrates a block diagram of a delay line in accordance with an embodiment of the invention with M=2, P=1, and non-inverting elements.

FIG. 8 illustrates a block diagram showing a delay line in accordance with an embodiment of the invention with M=2 and P=1, to obtain a resolution of 0.5τ. The node filters use non-inverting delay elements and non-inverting cross-coupling elements. The phase generator 80 splits the input signal IN into two phases Φ1 and Φ2, where Φ2 lags Φ1 by 0.5τ. Signal Φ1 enters the delay fabric at its first row, and propagates through the node filters 801, 803, 805, etc. through its last node filter, here denoted as 817. Signal Φ2 enters the delay fabric at node filter 802, and similarly propagates from the left to the right. The propagating signal is available at the outputs in the order OUT1, OUT2, OUT3, OUT4, etc. through OUT2N.

Node filters 801 is a reduced node filter, because no input exists that a cross-coupling element CCτ could electrically couple to. All other node filters are common node filters that may be implemented identically and electrically coupled to inputs or outputs of prior node filters in the same pattern.

To provide node filters of the N-th column of output nodes with loading equal to the prior stages, an embodiment may add a dummy column D of which the outputs are not used. In FIG. 8, no dummy stage has been added. If no dummy stage is used, an embodiment may add dummy cross-coupling elements or other means to provide consistent loading.

FIG. 9 illustrates a delay line in accordance with an embodiment of the invention with 2 delay chains with inverting elements. The figure shows how the architecture changes when inverting delay elements and inverting cross-coupling elements are used. Since now in each column the polarity alternates, a signal fed forward from a bottom row to a top row will have the wrong polarity. This occurs for the signals $\overline{OUT1}$, OUT3, etc. Where this occurs, the signal that is fed forward needs to be subtracted from the output signal of the delay element, rather than added. Therefore, node filters 92 include subtracters 93, which don't show in node filters 94. Subtracters are naturally available in embodiments for differential signals, where the polarity of a signal can be reversed by swapping its signal wires, but may be harder to implement in embodiments for single-ended signals.

FIG. 10 shows an embodiment of the invention with four phases: S=4, M=4, P=2, G=1, and D=0. The resolution of the system equals $\tau/4$. The phase generator 100 generates four phases (S=4), $\Phi_1$, $\Phi_2$, $\Phi_3$, and $\Phi_4$, where $\Phi_4$ lags $\Phi_3$ by $\tau/4$, and $\Phi_2$ lags $\Phi_1$ by $\tau/4$. The four phases are supplied to the four rows of the delay fabric (M=4). The delay fabric uses common node filters which input two signals (P=2) from other rows. A common node filter's input distances relative to the D-input are: −1 (C1 input), and −2 (C2 input). There are two reduced node filters, 1001 and 1002, because not all input signals exist for them. The delay fabric has 1 column with guard nodes (the node filters in the first column 1000 do not drive any output signals), hence G=1. There is no column of dummy node filters, so D=0.

FIG. 11 illustrates a delay line in accordance with an embodiment of the invention for a delay fabric with M=6, using a 3-way (S=3) phase generator. For clarity, cross-coupling is not shown. Whereas the delay fabric "expects" 6 phases at its inputs with a resolution of $\tau/6$, it actually receives three low-quality phases that are only $\tau/3$ apart. The delay fabric's inputs are grouped into three groups of inputs for consecutive signals to which the consecutive phase generator signals are applied. With sufficient cross-coupling, the delay fabric will soon correct these large input errors, and if sufficient guard columns are inserted (not shown in FIG. 11), the delay line will exhibit a clean resolution of $\tau/6$ on its outputs.

FIG. 12 illustrates using a checkerboard polarity pattern for embodiments with single-ended inverting delay elements. Signals appearing at the D-inputs of the node filters are assigned polarity in a checkerboard pattern, depicted by a diamond with a plus (+) or minus (−) sign in it. The arrangement enables realization of a row of the fabric with a chain of concatenated inverters. However, to ensure that node filters taking their input signals from two different columns get their input signals at the right polarity, the pattern of alternating polarities needs to continue from one column to the next. This means that for instance the first row of the second column needs to have opposite polarity from the last row of the first column. To achieve this, M must be odd, and at least 3. The polarity of the phase signals applied to the inputs needs to alternate to match the polarity required by the node filters in the first column.

Consider a common node filter 1201, at position n in the fabric. Its D-input is electrically coupled to the output of node filter 1202 at position n−M. Useful signals for the C-inputs are expected in the range n−M−1 to n−3M+1, and they must have opposite polarity from 1201 if the CCτ elements are implemented as inverters. In case of a delay fabric with M=9, as depicted, candidate outputs are in the locations n−M−2, n−M−4, n−M−6, n−M−8, n−M−10, n−M−12, n−M−14, and n−M−16 (1203 through 1210). This means that the practical maximum value for P is 8.

FIG. 13 illustrates how a modified checkerboard polarity pattern can be used for certain embodiments with even M.

The figure shows a double checkerboard pattern, where node filter output signals are vertically paired for polarity. To ensure continuity along columns, M can only have a value of 6, 10, 14, etc. There can no longer be a single common node filter, there will have to be one for each first signal of a pair, and a different one for each second signal of a pair.

Item 1301 is the first node filter n1 of a pair of positive signals. Its D-input is electrically coupled to node filter n1-M at location 1302. Positions suitable for the C-inputs are n1-M−3, n1-M−4, n1-M−7, n1-M−8, etc. (1303 through 1311).

Item 1321 is the second node filter n2 of a pair of positive signals. Its D-input is electrically coupled to node n2-M at location 1322. Positions suitable for the C-inputs are n2-M−1, n2-M−4, n2-M−5, n2-M−8, n2-M−9, etc. (1323 through 1331).

Since the distance patterns of suitable input signals are different for these two situations, the node filters may need to be different in order to achieve comparable results. This can be approached by using different scaling factors (drive strengths) in the CCτ elements.

Apparatuses for implementing delay fabrics and delay lines described herein and/or shown in the drawings are presented by way of example only and are not limiting as to the scope of the invention. Unless otherwise specifically stated, individual aspects and components of the apparatuses and delay lines may be modified, or may have been substituted therefore known equivalents, or as yet unknown substitutes such as may be developed in the future or such as may be found to be acceptable substitutes in the future.

Those skilled in the art will appreciate that the invention described herein is susceptible to variations and modifications other than those specifically described. All such variations and modifications are to be considered within the ambit of the present invention the nature of which is to be determined from the foregoing description.

It will be understood that the invention disclosed and defined in this specification extends to all alternative combinations of two or more of the individual features mentioned or evident from the text or drawings. All of these different combinations constitute various alternative aspects of the invention.

Although the description has been described with respect to particular embodiments thereof, these particular embodiments are merely illustrative, and not restrictive.

Any suitable technology for manufacturing electronic devices can be used to implement the circuits of particular embodiments, including bipolar, JFET, MOS, NMOS, PMOS, CMOS, BiCMOS, HBT, MESFET, FinFET, etc. Different semiconductor materials can be employed, such as silicon, germanium, SiGe, GaAs, InP, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular embodiments. In some particular embodiments, multiple elements, devices, or circuits shown as sequential in this specification can be operating in parallel.

Particular embodiments may be implemented in a computer-readable storage medium for use by or in connection with an instruction execution system, apparatus, system, or device. Particular embodiments can be implemented in the form of control logic in software, firmware, hardware or a combination of those. The control logic, when executed by one or more processors, may be operable to perform that which is described in particular embodiments.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

The invention claimed is:

1. A delay line with an input and four or more outputs, comprising:
   a phase generator with an input and two or more outputs, wherein the delay line input is electrically coupled with the phase generator input, and wherein the phase generator is configured to generate copies of an input signal at its two or more outputs, the copies occurring at evenly spaced delays after the input signal; and
   a delay fabric for delaying digital signals in continuous time with two or more inputs and four or more outputs, wherein the two or more inputs are electrically coupled with two or more of the two or more outputs of the phase generator, and the four or more outputs are electrically coupled with the four or more outputs of the delay line, and wherein the delay fabric includes an array of node filters capable of generating four or more simultaneous output signals each evenly spaced a small time apart, the small time being a fraction of a nominal delay time of delay elements used in the delay fabric, wherein:
      a node filter comprises a delay element and a cross-coupling element;
      a first input of the node filter is electrically coupled with an input of the delay element;
      a second input of the node filter is electrically coupled with an input of the cross-coupling element;
      output signals of the delay element and the cross-coupling element are added to or subtracted from each other to form a node filter output signal;
      an output of a first prior node filter is electrically coupled with the first node filter input;
      an output of a second prior node filter is electrically coupled with the second node filter input; and
   an output of the node filter, carrying the output signal, is electrically coupled to an output of the delay fabric.

2. The delay line of claim 1, wherein the number of outputs of the phase generator equals the number of inputs of the delay fabric, and each successive input of the delay fabric is electrically coupled with a successive output of the phase generator, such that a time difference between the successive output signals of said phase generator is a nominally equal delay time of delay elements and cross-coupling elements of node filters in the delay fabric divided by the number of inputs of the delay fabric.

3. The delay line of claim 1, wherein the delay element and the cross-coupling element have a nominally equal delay time.

4. The delay line of claim 3, wherein the delay of the delay element or the delay of the cross-coupling element is controlled by a back-gate voltage.

5. The delay line of claim 1, wherein the cross-coupling element has a lower drive strength than the delay element.

6. The delay line of claim 1, wherein the node filter further comprises one or more additional cross-coupling elements, an input of an additional cross-coupling element being electrically coupled with an additional input to the node filter, and an output signal of an additional cross-coupling element being added to or subtracted from the output signal of the node filter.

7. The delay line of claim 1, wherein:
   the array is arranged in two or more columns and two or more rows;
   node filters are counted column-wise, starting with a node filter of the first row of the first column, followed by a node filter of the second row of the first column, and wherein a first node filter of a subsequent column follows a last node filter of the last row of its directly preceding column, and ending with the node filter of the last row of the last column;
   inputs of node filters in the first column are electrically coupled with inputs of the delay fabric;
   inputs of node filters in a subsequent column are electrically coupled with outputs of node filters in a directly prior column; and
   node filters outputs are electrically coupled with delay fabric outputs.

8. The delay line of claim 7, wherein one or more columns of node filters, preceding columns of node filters whose outputs are electrically coupled with outputs of the delay fabric, are guard node filters, wherein said guard node filters are configured for initially correcting signals provided to and propagating through the delay fabric.

9. The delay line of claim 7, wherein one or more columns of node filters, following columns of node filters whose outputs are electrically coupled with outputs of the delay fabric, are dummy node filters, wherein said dummy node filters are configured for giving a last column of node filters whose outputs are electrically coupled with outputs of the delay fabric the same physical loading as outputs of preceding columns of node filters.

10. The delay line of claim 7, wherein respective inputs of node filters are electrically coupled with outputs of prior node filters, counting column-wise, in a consistent pattern.

11. The delay line of claim 1, wherein the delay element comprises an inverter gate, the input of the inverter gate forming the input of the delay element, and the output of the inverter gate forming an output of the delay element.

12. The delay line of claim 1, wherein the delay element has a differential input comprising an inverting and a non-inverting input and a differential output comprising an inverting and a non-inverting output, the delay element comprising:
   (a) a first inverter; and
   (b) a second inverter;
   wherein:
      (i) an input of the first inverter is electrically coupled to the non-inverting input of the delay element;

(ii) an output of the first inverter is electrically coupled to the inverting output of the delay element;
(iii) an input of the second inverter is electrically coupled to the inverting input of the delay element;
(iv) an output of the second inverter is electrically coupled with the non-inverting output of the delay element; and
(v) the first and second inverter have equal drive strengths.

13. The delay line of claim 12, wherein the delay element further comprises:
(c) a third inverter; and
(d) a fourth inverter;
wherein:
(vi) an input of the third inverter is electrically coupled to the non-inverting output of the delay element;
(vii) an output of the third inverter is electrically coupled to the inverting output of the delay element;
(viii) an input of the fourth inverter is electrically coupled to the inverting output of the delay element;
(ix) an output of the fourth inverter is electrically coupled to the non-inverting output of the delay element;
(x) the third and fourth inverters have equal drive strengths; and
(xi) the drive strengths of the third and fourth inverters are less than the drive strengths of the first and second inverters.

14. The delay line of claim 1, wherein the cross-coupling element is built similar to the delay element.

15. The delay line of claim 1, wherein the delay element or the cross-coupling element is operated from a regulated supply voltage.

16. The delay line of claim 1, wherein the delay element or the cross-coupling element is operated from a regulated supply current.

17. The delay line of claim 1, wherein the input is configured for receiving a differential input signal.

18. A phase generator with an input and two or more outputs for receiving a digital input signal at the phase generator input and generating copies of the input signal at the two or more outputs, the copies occurring at evenly spaced delays after the input signal, and the phase generator comprising:
a delay fabric for delaying digital signals in continuous time with two or more inputs and two or more outputs, wherein:
(i) the two or more delay fabric inputs are coupled with the phase generator input; and
(ii) the two or more delay fabric outputs are each coupled to one of the two or more phase generator outputs;
the delay fabric comprising an array of guard node filters capable of generating two or more simultaneous output signals each evenly spaced a small time apart, the small time being a fraction of a nominal delay time of delay elements used in the delay fabric, and the array being arranged in one or more columns and two or more rows, wherein:
a node filter comprises a delay element and a cross-coupling element;
a first input of the node filter is electrically coupled with an input of the delay element;
a second input of the node filter is electrically coupled with an input of the cross-coupling element;
output signals of the delay element and the cross-coupling element are added to or subtracted from each other to form a node filter output signal;
an output of a first prior node filter is electrically coupled with the first node filter input;
an output of a second prior node filter is electrically coupled with the second node filter input; and
an output of the node filter, carrying the output signal, is electrically coupled to an output of the delay fabric.

19. The phase generator of claim 18 wherein the phase generator input is configured for receiving differential digital input signals and wherein the two or more phase generator outputs are configured for delivering differential digital output signals.

* * * * *